United States Patent
Ongayi et al.

(10) Patent No.: US 9,442,377 B1
(45) Date of Patent: Sep. 13, 2016

(54) WET-STRIPPABLE SILICON-CONTAINING ANTIREFLECTANT

(71) Applicant: Rohm and Haas Electronic Materials LLC, Marlborough, MA (US)

(72) Inventors: Owendi Ongayi, Tarragona (ES); Charlotte Cutler, Marlborough, MA (US); Mingqi Li, Marlborough, MA (US); Shintaro Yamada, Marlborough, MA (US); James Cameron, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/739,402

(22) Filed: Jun. 15, 2015

(51) Int. Cl.
| | |
|---|---|
| *G03F 7/075* | (2006.01) |
| *G03F 7/11* | (2006.01) |
| *G03F 7/40* | (2006.01) |
| *G03F 7/09* | (2006.01) |
| *C08G 77/28* | (2006.01) |
| *C08G 77/14* | (2006.01) |
| *G03F 7/20* | (2006.01) |
| *C09D 183/08* | (2006.01) |
| *C09D 183/06* | (2006.01) |
| *C08G 77/18* | (2006.01) |

(52) U.S. Cl.
CPC ............ *G03F 7/091* (2013.01); *C08G 77/14* (2013.01); *C08G 77/18* (2013.01); *C08G 77/28* (2013.01); *C09D 183/06* (2013.01); *C09D 183/08* (2013.01); *G03F 7/0752* (2013.01); *G03F 7/20* (2013.01)

(58) Field of Classification Search
CPC .......................... G03F 7/0752; C08G 77/18
USPC ................... 430/272.1, 317, 512; 528/40
See application file for complete search history.

(56) References Cited

U.S. PATENT DOCUMENTS

| | | |
|---|---|---|
| 6,268,457 B1 | 7/2001 | Kennedy et al. |
| 6,420,088 B1 | 7/2002 | Angelopoulos et al. |
| 6,576,393 B1 | 6/2003 | Sugita et al. |
| 6,730,454 B2 | 5/2004 | Pfeiffer et al. |
| 7,270,887 B2 | 9/2007 | Yamaya et al. |
| 7,368,173 B2 | 5/2008 | Zhong et al. |
| 7,514,199 B2 | 4/2009 | Uh et al. |
| 7,605,439 B2 | 10/2009 | Gronbeck et al. |
| 7,955,782 B2 | 6/2011 | Mukhopadhyay et al. |
| 8,048,615 B2 | 11/2011 | Takei et al. |
| 8,809,482 B2 | 8/2014 | Fu et al. |
| 8,815,494 B2 | 8/2014 | Shibayama et al. |
| 8,828,879 B2 | 9/2014 | Kanno et al. |
| 8,852,844 B2 | 10/2014 | Ogihara et al. |
| 8,859,189 B2 | 10/2014 | Ogihara et al. |
| 2002/0195419 A1 | 12/2002 | Pavelchek |
| 2003/0235786 A1 | 12/2003 | Krishnamurthy et al. |
| 2004/0110896 A1 | 6/2004 | Yoshioka et al. |
| 2012/0070994 A1 | 3/2012 | Kanno et al. |
| 2014/0186774 A1 | 7/2014 | Glodde et al. |
| 2014/0235796 A1 | 8/2014 | Ogihara et al. |

FOREIGN PATENT DOCUMENTS

| | | |
|---|---|---|
| EP | 2597518 A2 | 5/2013 |
| EP | 1788433 B1 | 7/2014 |

*Primary Examiner* — John S Chu
(74) *Attorney, Agent, or Firm* — S. Matthew Cairns

(57) ABSTRACT

Wet-strippable antireflective compositions comprising one or more silicon-containing polymers that are free of Q-monomers and hydridosilanes as polymerized units are provided. These compositions are useful in the manufacture of various electronic devices.

14 Claims, No Drawings

WET-STRIPPABLE SILICON-CONTAINING ANTIREFLECTANT

The present invention relates generally to antireflective compositions and methods of using them, and particularly to silicon-containing antireflective compositions and their use in the manufacture of electronic devices.

In conventional photolithographic processes, the resist pattern is used as a mask for pattern transfer to the substrate by suitable etching processes, such as by reactive ion etch (RIE). The continued decrease in the thickness of the resist used makes the resist pattern unsuitable as a mask for pattern transfer by RIE processes. As a result, alternate processes have been developed using three, four or more layers as a mask for pattern transfer. For example, in a trilayer process a silicon-containing antireflective layer is disposed between an underlayer/organic planarizing layer and the resist layer. Due to the alternating selectivity towards fluorine and oxygen-containing RIE chemistry these layers possess, this trilayer scheme provides highly selective pattern transfer from the resist pattern on top of the Si-containing layer into the substrate below the underlayer.

The resistance of the silicon-containing antireflective layer toward oxide-etch chemistry allows this layer to function as an etch mask. Such silicon-containing antireflective layers are comprised of a crosslinked siloxane network. The etch resistance of these materials results from the silicon content, with a higher silicon content providing better etch resistance. In current 193 nm lithographic processes, such silicon-containing antireflective layers contain ≥40% silicon. Such high silicon content and siloxane network structure in these materials makes their removal challenging. Fluorine-containing plasma and hydrofluoric acid (HF) can both be used to remove (or strip) these silicon-containing layers. However, both F-plasmas and HF will remove not only these silicon-containing materials but also other materials that are desired to remain, such as the substrate. Wet stripping using tetramethylammonium hydroxide (TMAH) in higher concentrations, such as ≥5 wt %, can be used to remove at least some of these silicon-containing layers, but these higher concentrations of TMAH also risk damaging the substrate. Silicon-containing layers having a relatively lower amount of silicon (≤17%) can sometimes be removed using "piranha acid" (concentrated $H_2SO_4$+30% $H_2O_2$), but such an approach has not proved successful with silicon-containing materials having higher silicon content.

One approach to improving the wet strippability of silicon-containing underlayers by incorporating a mixture of dipropylene glycol (DPG) and tetraethylene glycol (TEG) into the siloxane layer during curing is disclosed in U.S. Pat. No. 7,955,782. However, the specific amount of DPG and TEG incorporated into silicon-containing film is not known as a portion of both the DPG and TEG is volatilized during curing of the silicon-containing film, which also makes the exact weight percentage of silicon in the film unknown. U.S. Pat. App. Pub. No. 2014/0186774 discloses silicon-containing antireflective layers that can be removed by acid, where the silicon-containing antireflective materials do not contain Si—O—C or Si—OH moieties that can be hydrolyzed under acidic conditions to form Si—O—Si bonds. In fact, the formation of Si—O—Si bonds during curing of the antireflective material layer is avoided in this reference. While the silicon-containing antireflective layers in U.S. Pat. App. Pub. No. 2014/0186774 might be acid-strippable, such silicon-containing antireflective layers may not provide the desired etch resistance during pattern transfer due to the lack of Si—O—Si bonds. Accordingly, there remains a need for a silicon-containing antireflective material that provides desired etch selectivity during pattern transfer and is readily removable by wet chemical processes.

The present invention provides a siloxane polymer comprising as polymerized units one or more first monomers of formula (1) or a dimer of formula (1) and one or more second monomers of formula (2) or a dimer of formula (2)

$$R_2SiX_2 \quad (1)$$

$$RSiX_3 \quad (2)$$

wherein each R is independently chosen from aryl, aralkyl, alkyl, alkenyl, aralkenyl, and $R^1$; $R^1$ is a $C_{2-30}$ organic radial comprising one or more —C(O)—O—C(O)— moieties; and each X is a hydrolyzable moiety; wherein at least one R is $R^1$; and wherein ≥30% of the monomers comprising the polymer comprise one or more functional moieties chosen from hydroxy, mercapto, epoxy, glycidyloxy, cyano, alkyleneoxy, sulfolanyl, and —C(O)—O—C(O)—; and wherein the polymer is free of monomers of the formula $HSiX_3$ and $SiX_4$ as polymerized units. The present siloxane polymers are curable.

Also provided by the present invention is a composition comprising the siloxane polymer described above and an organic solvent.

Further, the present invention provides a method of patterning comprising: (a) coating a substrate with the composition described above to form a siloxane polymer layer on the substrate; (b) curing the siloxane polymer layer to form a siloxane underlayer; (c) disposing a layer of a photoresist on the siloxane underlayer; (d) pattern-wise exposing the photoresist layer to form a latent image; (e) developing the latent image to form a patterned photoresist layer having a relief image therein; (f) transferring the relief image to the substrate; and (g) removing the siloxane underlayer.

It will be understood that when an element is referred to as being "on" another element, it can be directly adjacent to the other element or intervening elements may be present therebetween. In contrast, when an element is referred to as being "directly on" another element, there are no intervening elements present. It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; ppm=part per million; μm=micron=micrometer; nm=nanometer; Å=angstrom; L=liter; and mL=milliliter. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted. The articles "a", "an" and "the" refer to the singular and the plural. As used herein, the term "and/or" includes any and all combinations of one or more of the associated listed items.

As used throughout the specification, the term "alkyl" includes linear, branched and cyclic alkyl. Likewise, "alkenyl" refers to linear, branched and cyclic alkenyl. By the term "curing" is meant any process, such as polymerization or condensation, that increases the molecular weight of a material or composition. "Curable" refers to any material capable of being cured under certain conditions. The term "oligomer" refers to dimers, trimers, tetramers and other relatively low molecular weight materials that are capable of further curing. The term "polymer" includes oligomers and refers to both homopolymers and copolymers. Silicon monomers are often referred to by the number of hydrolyzable moieties bonded to silicon in the monomer. For example, "D monomer" refers to a silicon monomer having two hydrolyzable moieties such as monomers of the formula $R_2SiX_2$, "T monomer" refers to a silicon monomer having three hydrolyzable moieties such as monomers of the formula $RSiX_3$, and "Q monomer" refers to a to a silicon monomer having four hydrolyzable moieties such as monomers of the formula $SiX_4$, where X in each monomer is a hydrolyzable moiety. As used herein, "hydrolyzable moiety" refers to any moiety capable to being hydrolyzed under conditions used to condense, cure, or otherwise polymerize silane monomers. Exemplary hydrolyzable moieties in silicon monomers include, but are not limited to, halogens, alkoxy, carboxylate, hydroxy, enoxy, oximino, amino, and the like.

Siloxane polymers of the present invention comprise as polymerized units one or more first monomers of formula (1) or a dimer of formula (1) and one or more second monomers of formula (2) or a dimer of formula (2)

$$R_2SiX_2 \qquad (1)$$

$$RSiX_3 \qquad (2)$$

wherein each R is independently chosen from aryl, aralkyl, alkyl, alkenyl, aralkenyl, and $R^1$; $R^1$ is a $C_{2-30}$ organic radical comprising one or more —C(O)—O—C(O)— moieties; and each X is a hydrolyzable moiety; wherein at least one R is $R^1$; and wherein ≥30% of the monomers comprising the polymer comprise one or more functional moieties chosen from hydroxy, mercapto, epoxy, glycidyloxy, cyano, alkyleneoxy, sulfolanyl, and —C(O)—O—C(O)—; and wherein the polymer is free of monomers of the formula $HSiX_3$ and $SiX_4$ as polymerized units. Preferably, the present siloxane polymers are free of sulfide linkages, sulfonamide moieties, anionic moieties, and combinations thereof, and more preferably free of sulfide linkages, di-silane monomers (that is, monomers having Si—Si linkages), sulfonamide moieties, anionic moieties, and combinations thereof. It is preferred that each X is independently chosen from halogens, alkoxy, $C_{1-12}$ carboxylate, hydroxy, enoxy, oximino, amino, and the like, more preferably from halogens, $C_{1-12}$ alkoxy, hydroxy, $C_{2-12}$ enoxy, $C_{1-12}$ oximino, amino, $C_{1-12}$ alkylamino, and di($C_{1-12}$ alkyl)amino, and more yet more preferably from chlorine, $C_{1-12}$ alkoxy, $C_{1-10}$ carboxylate, hydroxy, $C_{2-6}$ enoxy, $C_{1-6}$ oximino, and di($C_{1-6}$ alkyl) amino.

In formulae (1) and (2), each R is preferably independently chosen from $C_{4-20}$ aryl, substituted $C_{4-20}$ aryl, $C_{5-20}$ aralkyl, substituted $C_{5-20}$ aralkyl, $C_{1-30}$ alkyl, substituted $C_{1-30}$ alkyl, $C_{2-30}$ alkenyl, substituted $C_{2-30}$ alkenyl, $C_{8-30}$ aralkenyl, substituted $C_{8-30}$ aralkenyl, and $R^1$; more preferably $C_{6-20}$ aryl, substituted $C_{6-20}$ aryl, $C_{6-15}$ aralkyl, substituted $C_{6-15}$ aralkyl, $C_{1-20}$ alkyl, substituted $C_{1-20}$ alkyl, $C_{2-20}$ alkenyl, substituted $C_{2-20}$ alkenyl, $C_{8-20}$ aralkenyl, substituted $C_{8-20}$ aralkenyl, and $R^1$; and yet more preferably $C_{6-20}$ aryl, substituted $C_{6-20}$ aryl, $C_{1-20}$ alkyl, substituted $C_{1-20}$ alkyl, and $R^1$. "Aryl" refers to $C_{6-20}$ aromatic carbocycles and $C_{4-20}$ aromatic heterocycles. Aromatic carbocycles are preferred aryl moieties. Each R may optionally be substituted by replacing one or more hydrogens with one or more substituent moieties or by inserting one or more heteroatom-containing moieties within a carbon chain. Suitable substituent moieties are chosen from $C_{1-20}$ alkyl, $C_{1-20}$ alkoxy, $C_{1-20}$ hydroxyalkyl, $C_{2-30}$ alkoxyalkyl, hydroxy, mercapto, epoxy, glycidyloxy, alkyleneoxy, and sulfolanyl; more preferably hydroxy, mercapto, glycidyloxy, alkyleneoxy, and sulfolanyl; and even more preferably hydroxy, mercapto and glycidyloxy. Suitable alkyleneoxy substituents are ethyleneoxy, propyleneoxy, butyleneoxy, and combinations thereof. Suitable heteroatom-containing moieties include oxy, carbonyl, oxycarbonyl, amino, amido, sulfido, thiocarbonyl, and the like. Exemplary R groups containing one or more heteroatom moieties include, but are not limited to, ethers, ketones, esters, amines, amides, sulfides, and thiones. The term "alkyleneoxy" as used herein includes poly(alkyleneoxy). For example, suitable alkyleneoxy moieties may have from 1 to 20, preferably from 1 to 12, more preferably from 2 to 10, and still more preferably from 5 to 10 alkyleneoxy repeat units. Suitable alkyleneoxy moieties are those of the formula:

$$(OCHR^3CHR^3)n\text{-}OR^4$$

wherein each $R^3$ is independently H or $CH_3$; $R^4$ is H, $C_{1-2}$ alkyl or $R^5$; $R^5$ is $C_{1-6}$ alkyl having one or more moieties chosen from hydroxy, mercapto, epoxy, glycidyloxy, cyano, sulfolanyl and —C(O)—O—C(O)—; and n=1-20. It is preferred that each $R^3$ is H. Preferably, $R^4$ is H, $CH_3$ or $R^5$, and more preferably $CH_3$ or $R^5$. It is preferred that n=1-12, more preferably 2-10, and even more preferably 5-10. $R^5$ is preferably $C_{1-6}$ alkyl having one or more moieties chosen from hydroxy, mercapto, epoxy, glycidyloxy, sulfolanyl, and —C(O)—O—C(O)—, and more preferably $C_{1-6}$ alkyl having one or more moieties chosen from hydroxy, epoxy, glycidyloxy, sulfolanyl, and —C(O)—O—C(O)—. Preferably, "substituted" aryl refers to any aryl moiety having one or more of its hydrogens replaced with one or more substituents selected from $C_{1-10}$ alkyl, $C_{1-10}$ alkoxy, $C_{1-10}$ hydroxyalkyl, $C_{2-20}$ alkoxyalkyl, and hydroxyl, and more preferably from $C_{1-10}$ alkyl, $C_{1-10}$ alkoxy, and hydroxyl. Exemplary aryl and substituted aryl groups are phenyl, naphthyl, anthracenyl, tolyl, xylyl, mesityl, hydroxyphenyl, hydroxynaphthyl, hydroxyanthracenyl, and the like. Exemplary aralkyl groups are benzyl, phenethyl, naphthylmethyl, antracenylmethyl, and the like. Exemplary aralkenyl groups are styrene, vinyl naphthylene, and vinylanthracene. Exemplary aromatic heterocycles suitable as aryl moieties include, but are not limited to, furan, benzofuran, thiophene, benzothiophene, pyrrole, pyridine, and the like. It is preferred that at least one R in either formula (1) or formula (2) is chosen from aryl, substituted aryl, aralkyl, and aralkenyl, preferably aryl, substituted aryl, and aralkyl, and more preferably phenyl, naphthyl, anthracenyl, hydroxyphenyl, and benzyl. Preferred alkyl or alkenyl moieties for R are $C_{1-30}$ alkyl and $C_{2-30}$ alkenyl; and more preferably $C_{1-20}$ alkyl. It is further preferred that at least one R is chosen from methyl, ethyl, propyl (iso-propyl or n-propyl), butyl (n-butyl, sec-butyl, tert-butyl, or iso-butyl), pentyl (neopentyl, isopentyl, or n-pentyl), cyclopentyl, cyclohexyl, norbornyl, vinyl, allyl, butenyl, pentenyl, cyclopentenyl, cyclohexenyl, norbornenyl, phenyl, naphthyl, anthracenyl, benzyl, hydroxyphenyl, phenethyl, naphthylmethyl, and anthracenylmethyl; yet more preferably methyl, ethyl, propyl, butyl, cyclopentyl, cyclohexyl, vinyl, allyl, cyclopentenyl, cyclohexenyl, phenyl, naphthyl, anthracenyl, benzyl and phenethyl; and still more preferably from methyl, ethyl, phenyl, naphthyl, anthracenyl, and benzyl.

$R^1$ is a $C_{2-30}$ organic radical comprising one or more —C(O)—O—C(O)— moieties. $R^1$ is preferably $C_{2-20}$ alkyl comprising one or more —C(O)—O—C(O)— moieties, and more preferably $C_{2-15}$ alkyl comprising one or more —C(O)—O—C(O)— moieties. Each $R^1$ comprises at least one —C(O)—O—C(O)— moiety, and may comprise two, three or more of such moieties. It is preferred that each $R^1$ comprises one or two C(O)—O—C(O)— moieties, and more preferably one —C(O)—O—C(O)— moiety. Preferably, the —C(O)—O—C(O)— moiety of $R^1$ is a 5-7 membered cyclic anhydride, and more preferably a 5 membered cyclic anhydride. More preferably each $R^1$ is chosen from an organic radical of the formula:

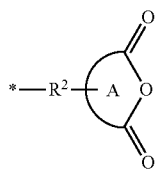

where $R^2$ is a chemical bond or a $C_{1-20}$ organic radical, A represents a 5-7 membered cyclic anhydride, and * represents the point of attachment to silicon. Preferably, $R^2$ is $C_{1-20}$ alkylene, substituted $C_{1-20}$ alkylene, $C_{1-20}$ alkenylene, or substituted $C_{1-20}$ alkenylene, more preferably $C_{1-15}$ alkylene, substituted $C_{1-15}$ alkylene, $C_{1-15}$ alkenylene, or substituted $C_{1-15}$ alkenylene, and yet more preferably $C_{2-15}$ alkylene or substituted $C_{2-15}$ alkylene. A is preferably a 5 membered cyclic anhydride. The $C_{2-30}$ organic radical of $R^1$ may be linear, branched or cyclic, and may be optionally substituted by replacing one or more hydrogens with one or more substituent moieties or by inserting one or more heteroatom-containing moieties within a carbon chain. Suitable substituent moieties are chosen from $C_{1-20}$ alkyl, $C_{1-20}$ alkoxy, $C_{1-20}$ hydroxyalkyl, $C_{2-30}$ alkoxyalkyl, hydroxy, mercapto, epoxy, glycidyloxy, alkyleneoxy, and sulfolanyl; more preferably hydroxy, mercapto, glycidyloxy, alkyleneoxy, and sulfolanyl; and even more preferably hydroxy, mercapto and glycidyloxy. Suitable heteroatom-containing moieties include oxy, carbonyl, oxycarbonyl, amino, amido, sulfido, thiocarbonyl, and the like. Exemplary R groups containing one or more heteroatom moieties include, but are not limited to, ethers, ketones, esters, amines, amides, sulfides, and thiones.

Exemplary groups for $R^1$ include, without limitation, dihydrofuran-2,5-dionyleth-2-yl, dihydrofuran-2,5-dionylprop-3-yl, dihydrofuran-2,5-dionylbut-4-yl, dihydrofuran-2,5-dionylbut-3-yl, dihydrofuran-2,5-dionylpent-5-yl, dihydrofuran-2,5-dionylpent-4-yl, dihydrofuran-2,5-dionyl-2,2-dimethylprop-3-yl, dihydrofuran-2,5-dionyl-2-methylprop-3-yl, dihydrofuran-2,5-dionylprop-2-yl, dihydrofuran-2,5-dionylhex-6-yl, dihydrofuran-2,5-dionylhex-4-yl, dihydrofuran-2,5-dionylhex-3-yl, isobenzofuran-1,3-dionyl-5-eth-2-yl, isobenzofuran-1,3-dionyl-5-prop-3-yl, isobenzofuran-1,3-dionyl-5-but-4-yl, benzo[de]isochromene-1,3-dionyl-6-propyl, 5-propylhexahydroisobenzofuran-1,3-dione, (3aS,4R,5S,7R,7aS)-5-(trimethoxysilyl)hexahydro-4,7-methanoisobenzofuran-1,3-dione, (3aS,4R,5S,7R,7aR)-5-(trimethoxysilyl)hexahydro-4,7-epoxyisobenzofuran-1,3-dione, dihydro-2H-pyran-2,6(3H)-dionyl-4-methyl, dihydro-2H-pyran-2,6(3H)-dionyl-4-eth-2-yl, dihydro-2H-pyran-2,6(3H)-dionyl-4-prop-3-yl, dihydro-2H-pyran-2,6(3H)-diony-4-lhex-6-yl, tetrahydro-1H-cyclopenta[c]furan-1,3(3aH)-dionyl-3a-prop-3-yl, hexahydroisobenzofuran-1,3-dionyl-3a-eth-2-yl, and dibenzo[c,e]oxepine-5,7-dionyl-2-ethyl. Preferably, $R^1$ is chosen from dihydrofuran-2,5-dionyleth-2-yl, dihydrofuran-2,5-dionylprop-3-yl, dihydrofuran-2,5-dionylbut-4-yl, dihydrofuran-2,5-dionylbut-3-yl, dihydrofuran-2,5-dionylpent-5-yl, dihydrofuran-2,5-dionylpent-4-yl, dihydrofuran-2,5-dionyl-2,2-dimethylprop-3-yl, dihydrofuran-2,5-dionyl-2-methylprop-3-yl, dihydrofuran-2,5-dionyl-prop-2-yl, dihydrofuran-2,5-dionylhex-6-yl, dihydrofuran-2,5-dionylhex-4-yl, and dihydrofuran-2,5-dionylhex-3-yl.

A wide variety of silane monomers of formulae (1) and (2) may be used to prepare the present siloxane polymers. Such monomers are generally commercially available, such as from Sigma-Aldrich (St. Louis, Mo.) or Gelest, Inc. (Tullytown, Pa.), or may be prepared by methods known in the literature. Such monomers may be used as-is, or may be further purified using known procedures. Suitable monomers of formulae (1) and (2) include, without limitation: methyl trichlorosilane; methyl trimethoxysilane; methyl triethoxysilane; hydroxymethyl trimethoxysilane; hydroxymethyl triethoxysilane; hydroxymethyl tripropyloxysilane; hydroxymethyl tributyloxysilane; ethyl trichlorosilane; ethyl trimethoxysilane; ethyl triethoxysilane; cyclopentyl trimethoxysilane; cyclopentyl triethoxysilane; dimethyl dichlorosilane; dimethyl dimethoxysilane; dimethyl diethoxysilane; vinyl triethoxysilane; allyl triethoxysilane, phenyl trichlorosilane; phenyl trimethoxysilane; phenyl triethoxysilane; diphenyl dimethoxysilane; diphenyl diethoxysilane; naphthyl trimethoxysilane; naphthyl triethoxysilane; benzyl trimethoxysilane; benzyl triethoxysilane; phenethyl trimethoxysilane; phenythyl triethoxysilane; hydroxyphenyl trichlorosilane; hydroxyphenyl trimethoxysilane; hydroxyphenyl triethoxysilane; glycidyloxymethyl trimethoxysilane; glycidyloxymethyl triethoxysilane; glycidyloxyethyl trimethoxysilane; glycidyloxyethyl triethoxysilane; glycidyloxypropyl trimethoxysilane; glycidyloxypropyl triethoxysilane; methyl glycidyloxypropyl dimethoxysilane; methyl glycidyloxypropyl diethoxysilane; methyl glycidyloxyethyl diethoxysilane; methyl glycidyloxyethyl dimethoxysilane; mercaptomethyl trimethoxysilane; mercaptomethyl triethoxysilane; mercaptoethyl trimethoxysilane; mercaptoethyl triethoxysilane; mercaptopropyl trimethoxysilane; mercaptopropyl triethoxysilane; mercaptocyclohexyl trimethoxysilane; hydroxycyclohexyl trimethoxysilane; cyanoethyl trimethoxysilane; cyanoethyl triethoxysilane; cyanopropyl trimethoxysilane; methyl mercaptomethyl dimethoxysilane; methyl mercaptopropyl diethoxysilane; methyl mercaptopropyl dimethoxysilane; methyl mercaptoethyl diethoxysilane; ethyl mercaptomethyl dimethoxysilane; ethyl mercaptomethyl diethoxysilane; dimethyl dimethoxysilane; diethyl diethoxysilane; methyl phenyl dimethoxysilane; methyl phenyl diethoxysilane; methyl hydroxyphenyl dimethoxysilane; hydroxymethyl phenyl dimethoxysilane; mercaptomethyl phenyl dimethoxysilane; methoxytriethyleneoxypropyl trimethoxysilane; 2-[methoxy(polyethyleneoxy)propyl]-trimethoxysilane having 6-9 moles of ethylene oxide; 2-[methoxy(polyethyleneoxy)propyl]-trimethoxysilane having 9-12 moles of ethylene oxide; and [2-hydroxy(polyethyleneoxy)propyl]trimethoxysilane having 8-12 mole of ethylene oxide. Suitable silane monomers of formulae (1) and (2) where one or more R groups is $R^1$ include, without limitation, dihydrofuran-2,5- dionyleth-2-yl trimethoxysilane; dihydrofuran-2,5-dionyleth-2-yl triethoxysilane; dihydrofuran-2,5-dionylprop-3-yl trimethoxysilane; dihydrofuran-2,5-dionylprop-3-yl triethoxysilane; dihydrofuran-2,5-dionylbut-4-yl trimethoxysilane; dihydrofuran-2,5-dionylbut-3-yl triethoxysilane; dihydrofuran-2,5-dionylpent-5-yl trimethoxysilane, dihydrofuran-2,5-dionylpent-4-yl triethoxysilane, dihydrofuran-2,5-dionyl-2,2-dimethylprop-3-yl triethoxysilane, dihydrofuran-2,5-dionyl-2-methylprop-3-yl trimethoxysilane, dihydrofuran-2,5-dionyl-prop-2-yl trimethoxysilane, dihydrofuran-2,5-dionylhex-6-yl triethoxysilane, dihydrofuran-2,5-dionylhex-4-yl trimethoxysilane, and dihydrofuran-2,5-dionylhex-3-yl trimethoxysilane.

Dimers of formula (1) have the formula X—Si(R)$_2$—O—Si(R)$_2$—X. Dimers of formula (2) have the formula X$_2$—Si(R)—O—Si(R)—X$_2$. Exemplary dimers of formulae (1) and (2) include, but are not limited to, tetramethyl diethoxy disiloxane, tetramethyl dimethoxy disiloxane, tetraphenyl dimethoxy disiloxane, tetraphenyl diethoxy disiloxane, tetraethyl dimethoxy disiloxane, tetraethyl diethoxy disiloxane, 1,3-dimethoxy-1,3-dimethyl-1,3-diphenyldisiloxane, diphenyl tetramethoxy disiloxane, diphenyl tetraethoxy disiloxane, dimethyl tetramethoxy disiloxane, dimethyl tetraethoxy disiloxane, diethyl tetramethoxy disiloxane, diethyl tetraethoxy disiloxane, bis[(3-methyldimethoxysilyl)propyl] polypropylene oxide having 2-30 moles of propylene oxide, bis(3-triethoxysilylpropyl)polyethylene oxide having from 25 to 30 moles of ethylene oxide, and bis[3-(triethoxysilyl-propoxy)-2-hydroxy-propoxy]polyethylene oxide having 5 to 8 moles of ethylene oxide.

Preferably, the present siloxane polymer comprises as polymerized units 2 or more different monomers of formula (1) or dimers thereof. It is also preferred that the present siloxane polymers comprise as polymerized units 2 or more different monomers of formula (2) or dimers thereof, and more preferably 2 or more different monomers of formula (2) or dimers thereof wherein the R groups in one monomer or dimer are different from the R groups in another monomer or dimer, and even more preferably wherein at least one R group in a monomer of formula (2) or dimer thereof is R$^1$, and even more preferably that at least one R group in each monomer of formula (2) or dimer thereof is R$^1$. Further, it is preferred that the present siloxane polymers comprise as polymerized units three or more different silane monomers chosen from (i) monomers of formula (1) and dimers thereof and monomers of formula (2) and dimers thereof, and more preferably the present siloxane polymers comprises as polymerized units four or more different silane monomers chosen from (i) monomers of formula (1) and dimers thereof and monomers of formula (2) and dimers thereof. More preferably, the siloxane polymers of the invention comprise as polymerized units two or more different monomers of formula (1) or dimers thereof and two or more different monomers of formula (2) or dimers thereof. It is further preferred that the present siloxane polymers comprise as polymerized units one or more monomers of formula (1) or dimers thereof, wherein at least one R is C$_{6-20}$ aryl or substituted C$_{6-20}$ aryl, and more preferably C$_{6-20}$ aryl or hydroxy C$_{6-20}$ aryl.

The particular amount of the monomer wherein at least one R is R$^1$ used in the present siloxane polymers is not critical, as long as some amount of such monomer is present. Typically, such monomer is present in an amount of ≥1 wt %, preferably ≥5 wt %, and more preferably ≥10 wt %. A typical upper limit for such monomer is 90 wt %, preferably 85 wt %, more preferably 75 wt %, and still more preferably 60 wt %. It is further preferred that such monomer is used in the present siloxane copolymers in an amount of from 10 to 90 wt %, more preferably from 10 to 75 wt %, yet more preferably from 10 to 60 wt %, and still more preferably from 15 to 60 wt %. In the present siloxane monomers, ≥30% of the total monomers comprising the polymer comprise one or more functional moieties chosen from hydroxy, mercapto, epoxy, glycidyloxy, cyano, alkyleneoxy, sulfolanyl, and —C(O)—O—C(O)—. Preferably, in the present siloxane polymers ≥35% of the total monomers comprising the polymer comprise one or more functional moieties chosen from hydroxy, mercapto, epoxy, glycidyloxy, cyano, alkyleneoxy, sulfolanyl, and —C(O)—O—C(O)—, more preferably ≥40%, yet more preferably ≥50 wt %, still more preferably from 30 to 100 wt %, even more preferably from 40 to 100 wt %, and yet more preferably from 40 to 95 wt % of the monomers comprise one or more functional moieties chosen from hydroxy, mercapto, epoxy, glycidyloxy, cyano, alkyleneoxy, sulfolanyl, and —C(O)—O—C(O)—. The siloxane polymers of the invention comprise ≤45 wt % silicon, preferably ≤40 wt %, and more preferably ≤35 wt %. A suitable range of silicon in the present polymers is from 15 to 45 wt %, and more preferably from 15 to 40 wt %.

The present siloxane polymers are hydrolysates and/or condensates of (a) one or more monomers of formula (1) or dimers thereof, and (b) one or more monomers of formula (2) or dimers thereof, and optionally one or more additional monomers that do not have the structure of formula (1) or formula (2). Any suitable weight ratio of the one or more monomers of formula (1) or dimers thereof to the one or more monomers of formula (2) or dimers thereof may be used, such as from 99:1 to 1:99, preferably from 95:5 to 5:95, more preferably from 90:10 to 10:90, and yet more preferably from 80:20 to 20:80. Any optional monomers may optionally be co-hydrolyzed or co-condensed with the present monomers to form siloxane polymers of the invention, provided that such additional monomers do not have the formula SiX$_4$, where X is a hydrolyzable moiety as described above. It is also preferred that such additional monomers are free of sulfide linkages, sulfonamide moieties, anionic moieties, and combinations thereof, and more preferably free of sulfide linkages, di-silane monomers (that is, monomers having Si—Si linkages), sulfonamide moieties, anionic moieties, and combinations thereof. It is further preferred that the present siloxane polymers comprise only silicon-containing monomers of formulae (1) and (2).

The preparation of siloxane polymers is well-known in the art and any suitable method may be used to prepare the present polymers. In general, the monomers used to form the present siloxane polymers are reacted with water, preferably in the presence of a catalyst which may be either acidic or basic, and optionally in the presence of one or more organic solvents. Preferably, an acid catalyst is used. Such reaction is carried out at a suitable reaction temperature. The monomers may be mixed together first, or may be separately added to the reaction vessel. The amount of water used is well-known to those skilled in the art, and is preferably from 0.5 to 1.5 equivalents relative to each hydrolyzable moiety present in the silane monomers, and more preferably from 0.75 to 1.25 equivalents, although greater or lesser amounts of water may be used. Suitable reaction temperatures for forming the present siloxane polymers are from 0 to 130° C., and preferably from 5 to 120° C. Suitable acid catalysts include mineral acids, carboxylic acids, and sulfonic acids such as alkanesulfonic acids and arylsulfonic acids. Exemplary acid catalysts include, but are not limited to: hydrofluoric acid, hydrochloric acid, hydrobromic acid, sulfuric acid, nitric acid, perchloric acid, phosphoric acid, acetic acid, propionic acid, butanoic acid, oxalic acid, malonic acid, trifluoroacetic acid, trichloroacetic acid, methanesulfonic acid, trifluoromethanesulfonic acid, ethanesulfonic acid, propanesulfonic acid, benzenesulfonic acid, toluenesulfonic acid, and phenolsulfonic acid, and preferably acetic acid, butanoic acid, toluenesulfonic acid, trifluoromethanesulfonic acid, and hydrochloric acid. Suitable basic catalysts are well-known to those skilled in the art. In general, the amount of such acid catalyst ranges from 0 to 1 equivalent relative to the silane monomers, preferably from 0.05 to 0.9, and more preferably from 0.05 to 0.75 equivalents.

A wide variety of optional organic solvents may be used in the preparation of the present siloxane polymers, such as alcohols, ketones, esters, ethers, aromatic hydrocarbons, alkanes, lactones, and the like. Exemplary organic solvents include, without limitation, methanol, ethanol, 1-propanol, 2-propanol, 1-butanol, 2-butanol, 2-methyl-1-propanol, 4-methyl-2-pentanol, ethylene glycol, propylene glycol, acetone, acetonitrile, tetrahydrofuran, toluene, hexane, ethyl acetate, ethyl lactate, cyclohexane, methyl-2-n-amyl ketone, butanediol monomethyl ether, propylene glycol monomethyl ether (PGME), propylene glycol monoethyl ether (PGEE), ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, gamma-butylolactone, and mixtures thereof. Water miscible organic solvents are preferred. The amount of such optional organic solvent is from 0 to 80%, and preferably from 10 to 50%, relative to the total weight of the silane monomers.

Alternatively, one or more monomers of formula (1) or dimers thereof and one or more monomers of formula (2) or dimers thereof are first reacted with water, optionally in the presence of an organic solvent, and optionally in the presence of a catalyst, and preferably an acid catalyst. Following such hydrolysis and/or condensation reaction, the resulting siloxane polymer may optionally be reacted with one or more additional monomers.

If desired, the siloxane polymers may be isolated from the reaction mixture by any suitable means, such as by precipitation, crystallization, chromatography, and the like. The siloxane polymers may be used as is or may be further purified by any means known in the art.

Compositions of the present invention comprise an organic solvent and one or more siloxane polymers, each siloxane polymer comprising as polymerized units (i) one or more first monomers of formula (1) or dimers thereof and (ii) one or more second monomers of formula (2) or dimers thereof

$$R_2SiX_2 \quad (1)$$

$$RSiX_3 \quad (2)$$

wherein each R is independently chosen from aryl, substituted aryl, aralkyl, alkyl, alkenyl, aralkenyl, and $R^1$; $R^1$ is a $C_{2-30}$ organic radial comprising one or more —C(O)—O—C(O)— moieties; and each X is a hydrolyzable moiety; wherein at least one R is $R^1$; and wherein ≥30% of the monomers comprising the polymer comprise one or more functional moieties chosen from hydroxy, mercapto, epoxy, glycidyloxy, cyano, alkyleneoxy, sulfolanyl, and —C(O)—O—C(O)—; and wherein the polymer is free of monomers of the formula $HSiX_3$ and $SiX_4$ as polymerized units. Optionally, these compositions may further comprise one or more siloxane polymer stabilizers, one or more organic polymers, one or more secondary siloxane polymers different from the siloxane polymers of the invention, one or more coating enhancers, curing catalyst, and the like, and any combination of the foregoing components. Preferably, the present compositions comprise one or more siloxane polymers of the invention, one or more organic solvents, one or more siloxane polymer stabilizers, one or more organic polymers, one or more coating enhancers, and curing catalyst. Typically, the siloxane polymers of the invention are present in the compositions in an amount of 0.1 to 25% of total solids, preferably from 0.5 to 15% of total solids, and more preferably from 0.5 to 10% of total solids. Compositions of the present invention may be prepared by combining the one or more present siloxane polymers, organic solvent, and any optional components in any order.

A variety of organic solvents may be used in the present compositions, provided that such solvent dissolves the components of the composition. Solvents may be used alone or a mixture of solvents may be used. Suitable organic solvents include, but are not limited to; ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as PGME, PGEE, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, methyl hydroxyisobutyrate, ethyl pyruvate, butyl acetate, methyl 3-methoxypropionate, ethyl 3-ethoxypropionate, tert-butyl acetate, tertbutyl propionate, and propylene glycol mono-tert-butyl ether acetate; lactones such as gamma-butyrolactone; and any combination of the foregoing. Preferred solvents are PGME, PGMEA, ethyl lactate, methyl hydroxyisobutyrate and combinations thereof.

One or more siloxane polymer stabilizers may optionally be added to the present compositions. Such stabilizers are useful for preventing unwanted hydrolysis or condensation of the siloxane polymers during storage. A variety of such stabilizers are known. Suitable stabilizers for the siloxane polymers include, without limitation, carboxylic acids, carboxylic acid anhydrides, mineral acids, and the like. Exemplary stabilizers include oxalic acid, malonic acid, malonic anhydride, malic acid, maleic acid, maleic anhydride, fumaric acid, citraconic acid, glutaric acid, glutaric anhydride, adipic acid, succinic acid, succinic anhydride, and nitric acid. Such stabilizers are used in an amount of 0 to 20% of total solids, preferably from 0.1 to 15% of total solids, more preferably from 0.5 to 10% of total solids, and yet more preferably from 1 to 10% of total solids.

Optionally, one or more organic polymers may be added to the present compositions. The term "organic polymers" as used herein refers to polymers having a backbone that is free of silicon atoms. Such organic polymers may contain silicon atoms in moieties that are pendant from the polymer backbone, such as a polymer comprising as polymerized units one or more silicon-containing (meth)acrylate monomers. A wide variety of organic polymers may be used, such as (meth)acrylate polymers, novolak polymers, styrenic polymers, polyarylenes, polyarylene ethers, benzcyclobutene polymers, polyester polymers, and copolymers of any of the foregoing. The term "(meth)acrylate" refers to both "acrylate" and "methacrylate". It is preferred that the organic polymer is a (meth)acrylate polymer, more preferably a methacrylate polymer, and even more preferably a methacrylate copolymer. Suitable methacrylate copolymers comprise as polymerized units one or more $C_{1-20}$ alkyl methacrylate monomers and one or more ethylenically unsaturated monomers that can be co-polymerized with the $C_{1-20}$ alkyl methacrylate monomer under free-radical polymerization conditions. Exemplary $C_{1-20}$ alkyl methacrylate monomers include methyl methacrylate, ethyl methacrylate, propyl methacrylate, butyl methacrylate, adamantyl methacrylate, and the like. Such ethylenically unsaturated monomers that can be co-polymerized with the $C_{1-20}$ alkyl methacrylate monomers are well-known in the art and include, without limitation: methacrylic acid; $C_{1-20}$ alkyl acrylate monomers such as methyl acrylate and norbornyl acrylate; hydroxy $C_{1-20}$ alkyl (meth)acrylate monomers such as hydroxyethyl methacrylate, hydroxyethyl acrylate, hydroxypropyl methacrylate, and hydroxypropyl acrylate; $C_{6-16}$ aryl (meth)acrylate monomers such as benzyl acrylate and benzyl methacrylate; vinyl monomers such as allyl (meth)acrylate, styrene, and divinyl benzene; and the like. When an organic polymer is used in the present compositions, the weight ratio of the present siloxane polymer to the organic polymer is from 99:1 to 50:50, and preferably from 95:5 to 55:45. Suitable organic polymers are generally commercially available or may be prepared by various methods known in the literature.

Any siloxane polymer that is structurally different from the siloxane polymers of the invention may be used as the secondary siloxane polymer. Such secondary siloxane polymers are generally compatible with the siloxane polymers of the invention, and provide for an increased percentage of silicon in the final polymer film. When used, the weight ratio of the present siloxane polymer to the secondary siloxane polymer is from 99:1 to 50:50, and preferably from 95:5 to 55:45. Suitable secondary siloxane polymers are generally commercially available or may be prepared by various methods known in the literature. One or more than one secondary siloxane polymers may be used in the present compositions. Exemplary secondary siloxane polymers include, but are not limited to: polydimethylsiloxanes terminated with reactive moieties such as succinic anhydride terminated polydimethylsiloxane, carbinol terminated polydimethylsiloxane, and glycidyloxypropyl terminated polydimethylsiloxane; siloxane polymers comprising $SiX_4$ as polymerized units, wherein X is a hydrolyzable moiety such as siloxane polymers comprising tetraethyl orthosilicate and methyl triethyoxysilane as polymerized units; and the like.

Coating enhancers are optionally added to the present compositions to improve the quality of a film or layer of the composition that is coated on a substrate. Such coating enhancers may function as plasticizers, surface leveling agents, and the like. Such coating enhancers are well-known to those skilled in the art, and are generally commercially available. Exemplary coating enhancers are: long chain alkanols such as oleyl alcohol, cetyl alcohol, and the like; glycols such as tripropylene glycol, tetraethylene glycol, and the like; and surfactants. While any suitable surfactant may be used as a coating enhancer, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. It is preferred that one or more coating enhancers are used in the present compositions. The coating enhancers are typically used in the present compositions in an amount of 0 to 10% of total solids, preferably from 0.5 to 10% of total solids, and more preferably from 1 to 8% of total solids.

A curing catalyst is optionally used in the present compositions to promote curing of the siloxane polymer. Preferably, a curing catalyst is used in the present compositions. Suitable curing catalysts include, but are not limited to, thermal acid generators, photoacid generators, and quaternary ammonium halides, preferably thermal acid generators and quaternary ammonium halides, and more preferably quaternary ammonium halides. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids like amine blocked dodecylbenzenesulfonic acid. A wide variety of photoacid generators are known in the art and are also generally commercially available, such as from Wako Pure Chemical Industries, Ltd., and from BASF SE. Suitable quaternary ammonium halides are: benzyltrialkylammonium halides such as benzylreiethylammonium halides; and tetraalkylammonium halides, such as tetramethylammonium halides, tetraethylammonium halides; and the like. Tetraalkylammonium halides are generally commercially available, such as from Sigma-Aldrich. Such optional curing catalysts are used in the present compositions in an amount of from 0 to 10% of total solids, preferably from 0.01 to 7% of total solids, and more preferably from 0.05 to 5% of total solids.

When the compositions of the invention are used as underlayers, it is preferred that the compositions comprise one or more chromophore moieties. Preferably, one or more of the siloxane polymers of the invention, one or more of the optional organic polymers, one or more of the optional secondary siloxane polymers, or any combination of these has a chromophore moiety, and more preferably at least one of the siloxane polymers of the invention has a chromophore. Suitable chromophores are aryl moieties, substituted aryl moieties, aralkyl moieties or aralkenyl moieties, such as $C_{6-20}$ aryl, substituted $C_{6-20}$ aryl, $C_{6-20}$ aralkyl, and $C_{8-30}$ aralkenyl. Exemplary chromophore moieties include, without limitation, phenyl, naphthyl, anthracenyl, benzyl, phenethyl, tolyl, xylyl, styrenyl, vinylnaphthalene, ainylanthracene, and the like, and preferably phenyl, naphthyl, anthracenyl, and benzyl. It is more preferred that at least one R in at least (i) one first silane monomer of formula (1) or a dimer of formula (1) or (ii) one second silane monomer of formula (2) or a dimer of formula (2) is chosen from aryl, substituted aryl, and aralkyl, and more preferably from $C_{6-20}$ aryl, substituted $C_{6-20}$ aryl, $C_{6-20}$ aralkyl, or $C_{8-30}$ aralkenyl. Alternatively, at least one of the optional organic polymers has a chromophore moiety. Preferred organic polymers having a chromophore moiety are homopolymers and copolymers comprising as polymerized units one or more monomers chosen from styrene, hydroxystyrene, divinylbenzene, vinylnaphthalene, vinylanthracene, benzyl (meth)acrylate, naphthyl (meth)acrylate, anthracenyl (meth)acrylate, anthracenylmethyl (meth)acrylate, and the like. Exemplary secondary siloxane polymers having a chromophore include, but are not limited to, poly(phenyl methyl siloxane), poly (phenyl siloxane), and the like.

The present siloxane polymers are useful in the manufacture of various electronic devices, such as in a method of patterning a substrate comprising: (a) coating a substrate with the composition described above to form a siloxane polymer layer on the substrate; (b) curing the siloxane polymer layer to form a siloxane underlayer; (c) disposing a layer of a photoresist on the siloxane underlayer; (d) patternwise exposing the photoresist layer to form a latent image; (e) developing the latent image to form a patterned photoresist layer having a relief image therein; (f) transferring the relief image to the substrate; and (g) removing the siloxane underlayer. Optionally, a high carbon-content organic coating layer is coated on the substrate prior to step (a). By a "high carbon-content" organic coating is meant an organic coating having ≥60 wt % carbon, preferably 60 to 100 wt %, more preferably 60 to 90 wt %, and even more preferably 60 to 80 wt %.

The present compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the siloxane polymer on the substrate. It will be appreciated by those skilled in the art that the thickness of the siloxane polymer layer may be adjusted by changing the spin speed, as well as the solids content of the composition.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

After being coated on the substrate, the siloxane polymer layer is optionally soft-baked at a relatively low temperature to remove any solvent and other relatively volatile components from the underlayer. Typically, the substrate is baked at a temperature of ≤200° C., preferably from 100 to 200° C., and more preferably from 100 to 150° C. The baking time is typically from 10 seconds to 10 minutes, preferably from 30 seconds to 5 minutes, and more preferably from 60 to 90 seconds. When the substrate is a wafer, such baking step may be performed by heating the wafer on a hot plate. Such soft-baking step may be performed as part of the curing of the siloxane polymer, or may be omitted altogether.

The siloxane polymer layer is then cured to form a siloxane underlayer. The siloxane polymer is sufficiently cured such that the film does not intermix with a subsequently applied organic layer, such as a photoresist or other organic layer disposed directly on the underlayer, while still maintaining the desired antireflective properties (n and k values) and etch selectivity of the underlayer film. The siloxane polymer layer may be cured in an oxygen-containing atmosphere, such as air, or in an inert atmosphere, such as nitrogen and under conditions, such as heating, sufficient to provide a cured siloxane underlayer. This curing step is conducted preferably on a hot plate-style apparatus, although oven curing may be used to obtain equivalent results. Typically, such curing is performed by heating the siloxane polymer layer at a curing temperature of ≤350° C., and preferably 200 to 250° C. Alternatively, a two-step curing process or a ramped temperature curing process may be used. Such two-step and ramped temperature curing conditions are well-known to those skilled in the art. The curing temperature selected should be sufficient for any thermal acid generator used to liberate acid to aid in curing of the siloxane polymer film. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times. Following this curing step, the underlayer surface may optionally be passivated by treatment with a passivating agent such as a disilazane compound, such as hexamethyldisilazane, or by a dehydration bake step to remove any adsorbed water. Such passivating treatment with a disilazane compound is typically performed at 120° C.

After curing of the siloxane polymer layer to form a siloxane underlayer, one or more processing layers, such as photoresists, hardmask layers, bottom antireflective coating (or BARC) layers, and the like, may be disposed on the siloxane underlayer. For example, a photoresist layer may be disposed, such as by spin coating, directly on the surface of the siloxane underlayer. Alternatively, a BARC layer may be coated directly on the siloxane underlayer, followed by curing of the BARC layer, and coating a photoresist layer directly on the cured BARC layer. In another alternative, an organic underlayer is first coated on a substrate and cured, a siloxane polymer layer of the invention is then coated on the cured organic underlayer, the siloxane polymer layer is then cured to form a siloxane underlayer, an optional BARC layer may be coated directly on the siloxane underlayer, followed by curing of the optional BARC layer, and coating a photoresist layer directly on the cured BARC layer. A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists, or may be conventional negative resists. The photoresist layer is then imaged (exposed) using patterned actinic radiation, and the exposed photoresist layer is then developed using the appropriate developer to provide a patterned photoresist layer. The pattern is next transferred from the photoresist layer to any optional BARC layer, and then to the siloxane underlayer by an appropriate etching technique, such as dry etching with an appropriate plasma. Typically, the photoresist is also removed during such etching step. Next, the pattern is transferred to any organic underlayer present using an appropriate technique, such as dry etching with O₂ plasma, and then to the substrate as appropriate. Following these pattern transfer steps, the siloxane underlayer, and any optional organic underlayers are removed using conventional techniques. The electronic device substrate is then further processed according to conventional means.

The present siloxane polymers provide siloxane underlayers having good etch resistance and high silicon content (≤45% Si). The siloxane polymers and siloxane underlayers of the invention are wet strippable. By "wet strippable" is meant that the siloxane polymers and siloxane underlayers of the invention are substantially removed (≥95% of film thickness) by contacting the siloxane polymers or siloxane underlayer with conventional wet stripping compositions, such as an aqueous base composition, such as aqueous alkali (typically about 5%), aqueous tetramethylammonium hydroxide (typically ≥3 wt %), or aqueous fluoride ion strippers such as ammonium fluoride/ammonium bifluoride mixtures, a mixture of sulfuric acid and hydrogen peroxide, or a mixture of ammonia and hydrogen peroxide. A particular advantage of the present polymers, and particularly of the present siloxane underlayers, is that they are wet strippable upon contact with either (i) a mixture of sulfuric acid and hydrogen peroxide, or (ii) a mixture of ammonia and hydrogen peroxide. A suitable mixture of sulfuric acid and hydrogen peroxide is concentrated sulfuric acid+30% hydrogen peroxide. A suitable mixture of ammonia and hydrogen peroxide is a mixture of Ammonia+hydrogen peroxide+water in a weight ratio of 1:1:5 or 1:1:10. Preferably, ≥97%, and more preferably ≥99%, of the film thickness of the siloxane underlayer is removed by contacting the siloxane polymers or siloxane underlayer with either (i) mixture of sulfuric acid and hydrogen peroxide or (ii) a mixture of ammonium hydroxide and hydrogen peroxide. Another advantage of the present siloxane polymers is that they are easily removed to allow re-work of the substrate, such as a wafer. In such a re-work process, a composition described above comprising one or more siloxane polymers of the invention is coated on a substrate. The coated siloxane polymer layer is then optionally soft-baked, and then cured to form a siloxane underlayer. Next, a photoresist layer is coated on the siloxane underlayer, and the resist layer is imaged and developed. The patterned resist layer and the siloxane underlayer may then each be removed to allow the wafer to be re-worked. The siloxane underlayer is contacted with any of the above-described wet stripping compositions, such as aqueous tetramethylammonium hydroxide compositions (typically ≥3 wt %) and aqueous fluoride ion strippers such as ammonium fluoride/ammonium bifluoride mixtures, at a suitable temperature to remove the siloxane underlayer to provide the substrate free, or substantially free, of siloxane underlayer and readily undergo additional re-work as may be necessary. Such re-work includes coating another layer of the present siloxane polymers on the substrate and processing the siloxane polymer coating as described above.

EXAMPLE 1

Preparation of Polymer 1

A 3-necked round bottom flask was equipped with a thermocouple, a magnetic stir bar, a N₂ feed line, a bubbler, and a heating oil bath. Dihydrofuran-2,5-dionylpropyl triethoxysilane (9.13 g, 30 mmol), mercaptopropyl trimethoxysilane (5.89 g, 30 mmol), tetramethyl diethoxy disiloxane (16.68 g, 75 mmol) and diphenyl diethoxysilane (4.08 g, 15 mmol) were measured by weight and charged into the reactor using PGMEA (10 g, 0.32 volume to total monomer weight) to aid the transfer. In a separate container, acetic acid (0.575 g, 9.57 mmol) and DI water (14.04 g, 788 mmol) were measured by weight and mixed together. The resulted acetic acid aqueous solution was charged to the reactor at ambient temperature. A two phase mixture was obtained after addition. The batch was stirred at ambient temperature for 30 minutes. A mild exothermic effect was observed (batch temperature increased from 22° C. to 26° C. and stabilized during the first 15 minutes of stirring). Then, the oil bath temperature was adjusted to 110° C. to initiate distillation.

The batch was stirred at reflux temperature (110° C.) and the reaction was followed by collecting distillates for 5 hours to achieve the desired distillate and molecular weight range (1200-1500 Da). The batch temperature was adjusted to ambient temperature over 1 hour. The residual water was azeotroped out of the reaction mixture using ethanol by setting a rotary evaporator bath temperature to 45° C. Azeotrope distillation was followed by monitoring the distillate collected in the rotary evaporator. The weight average molecular weight ($M_w$) the final polymer solutions were determined by gel permeation chromatography (GPC) using polystyrene standards and was found to be 1277 Da. Polymer 1 had a silicon content of 27 wt %. The structure of Polymer 1 is shown below, with the relative amounts of the monomers indicated. "R" refers to ethyl, methyl, or H.

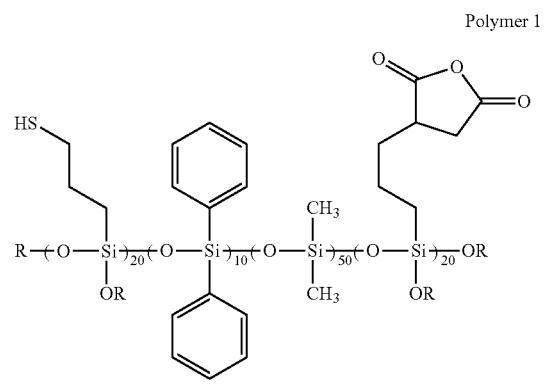

Polymer 1

EXAMPLE 2

Preparation of Polymer 2

A 3-necked round bottom flask was equipped with a thermocouple, a magnetic stir bar, a N₂ feed line, a bubbler, and a heating oil bath. Dihydrofuran-2,5-dionylpropyl triethoxysilane (9.13 g, 30 mmol), mercaptopropyl trimethoxysilane (5.89 g, 30 mmol), methyl mercaptopropyl diethoxysilane (13.53 g, 75 mmol) and methyl phenyl diethoxysilane (2.73 g, 15 mmol) were measured by weight and charged into the reactor using PGMEA (10 g, 0.32 volume to total monomer weight) to aid the transfer. In a separate container, acetic acid (0.575 g, 9.57 mmol) and DI water (14.2 g, 788 mmol) were measured by weight and mixed together. The resulting acetic acid aqueous solution was charged to the reactor at ambient temperature. A two phase mixture was obtained after addition. The batch was stirred at ambient temperature for 30 minutes. A mild exothermic effect was observed with the batch temperature increasing from 22 to 26° C. and stabilizing during the first 15 minutes of stirring. Then, the oil bath temperature was adjusted to 110° C. to initiate distillation.

The batch was stirred at reflux temperature (110° C.) and reaction was followed by collecting distillates for 5 hours to achieve the desired distillate and molecular weight range (1200-1500 Da). The batch temperature was adjusted to ambient temperature over 1 hour. Due to use of a 5-fold excess water, the residual water was azeotroped out of the reaction mixture using ethanol by setting a rotary evaporator bath temperature to 45° C. Azeotrope distillation was followed by monitoring the distillate collected in the rotary evaporator. The percentage of solids of the reaction mixture was obtained and the resultant mixture was diluted to 11% solids in PGMEA. The final polymer solution was analyzed using GPC. Polymer 2 had an $M_w$ of 1234 Da and a silicon content of 25 wt %. The structure of Polymer 2 is shown below, with the relative amounts of the monomers indicated. "R" refers to ethyl, methyl, or H.

Polymer 2

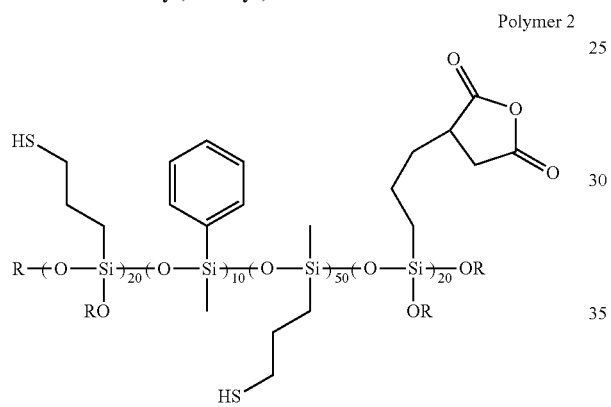

EXAMPLE 3

Preparation of Polymer 3

The procedure of Example 1 was repeated except that the mercaptopropyl trimethoxysilane was replaced with 30 mmol of methyl glycidyloxypropyl diethoxysilane and the diphenyl diethyoxysilane was replaced with an appropriate amount of methyl phenyl dimethoxysilane to provide Polymer 3, shown below, where "R" refers to ethyl, methyl or H. Polymer 3 had an $M_w$ of 1376 Da and a silicon content of 26 wt %.

Polymer 3

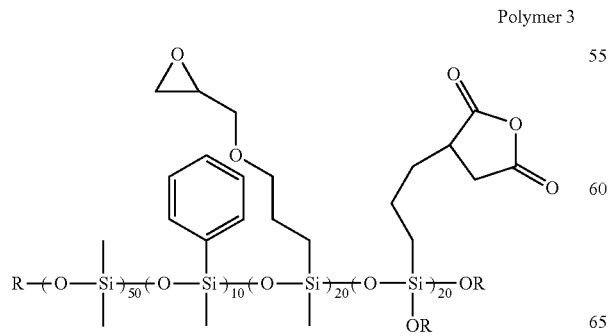

EXAMPLE 4

Preparation of Polymer 4

The procedure of Example 3 was repeated except that the tetramethyl diethoxydisilane was replaced with hydroxymethyl triethoxysilane, and the molar amounts of the monomers were changed to provide Polymer 4 shown below, with the relative amounts of the monomers indicated. "R" refers to ethyl, methyl, or H. Polymer 4 had an $M_w$ of was 2817 Da and a silicon content of 21 wt %.

Polymer 4

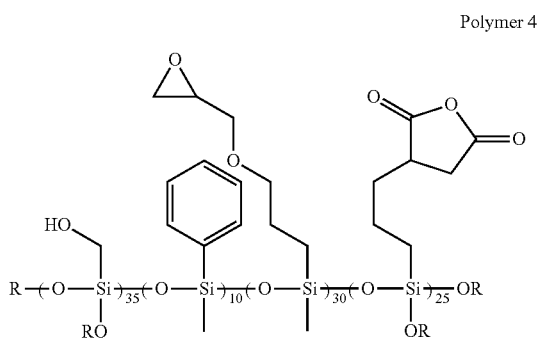

EXAMPLE 5

The procedures of Examples 1 or 2 were repeated to prepare Polymers 5-7, shown below, where R in each case is ethyl, methyl or H. The silicon content of Polymer 5 was 23 wt %, and the silicon content of each of Polymers 6 and 7 was 24 wt %. Polymers 5-7 had weight average molecular weights of 2616 Da, 3119 Da, and 2026 Da, respectively.

Polymer 5:

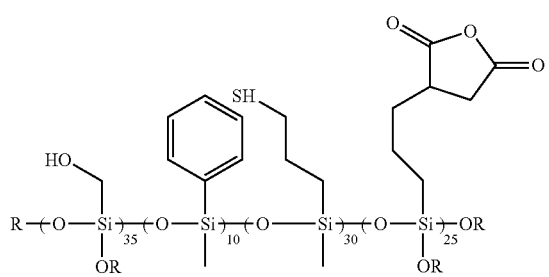

Polymer 6:

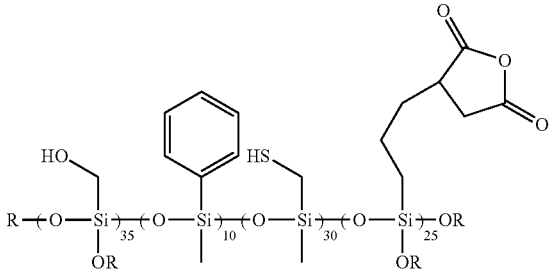

Polymer 7:

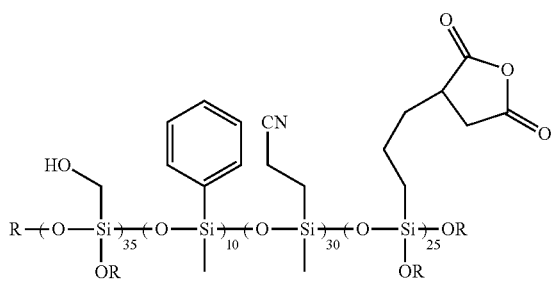

EXAMPLE 6

Preparation of Comparative Polymer 1

A 3-L 4-necked round bottom flask was equipped with a thermocouple, an over head stirrer, a water-cooling condenser, an addition funnel, a $N_2$ feed line, a bubbler, and a heating mantle. Methyl triethoxysilane (99.80 g, 733 mmol), phenyl trimethoxysilane (50.41 g, 254 mmol), vinyl triethoxysilane (62.75 g, 423 mmol) and tetraethyl orthosilicate (293.77 g, 1410 mmol) were measured by weight and charged into the reactor using PGMEA (466.80 g) to aid the transfer. Agitation was initiated at about 200 rpm. In a separate container, acetic acid (35.52 g, 592 mmol) and DI water (160.02 g, 8880 mmol) were measured by weight and mixed together. The resulting acetic acid aqueous solution was charged to the reactor via addition funnel over 10 min. at ambient temperature. A two phase mixture was obtained after addition. The batch was stirred at ambient temperature for 1 hour. A mild exothermic effect was observed (batch temperature increased from 22 to 26° C. and stabilized during the first 15 minutes of stirring) and the batch turned to a homogeneous, clear solution. Then, the batch temperature was adjusted to 85° C. over 30 minutes to initiate reflux.

The batch was stirred at reflux temperature (82 to 85° C.) for 6 hours to achieve the desired molecular weight range ($M_n$: 1200±200 Da; $M_w$: 3500±500 Da). The reaction progress was followed by in-process control (IPC) analysis with GPC. After the desired molecular weight was achieved, the batch temperature was adjusted to ambient temperature over 1 hour. After dilution with PGMEA (333.19 g), the batch was concentrated portionwise on a rotary evaporator under reduced pressure at water bath temperature of 45° C. for exactly 30 min. After combining the two concentrated portions, the final weight of batch was 942 g. The batch was further diluted with PGMEA to a 2 kg total weight (approximately 10 wt %). Comparative Polymer 1 had a silicon content of 42 wt %.

Comparative Polymer 1

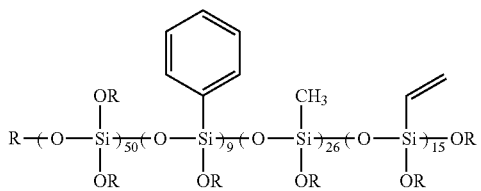

EXAMPLE 7

Underlayer Samples A and B and Comparative Sample 1 were prepared by combining the components shown in Table 1. The total solids content of each of these samples was 3-3.2%, to provide a film having a target thickness of 400 Å at a spin speed of 1500 rpm. The percentages in Table 1 are all "% of total solids". Each of the Samples included an ammonium halide as a cure catalyst, a long chain alkanol as a coating enhancer, and a mineral acid as the siloxane stabilizer, in the amounts reported in Table 1. The solvent ratio was w/w. In Table 1, "HEMA/MMA" refers to a copolymer of hydroxyethyl methacrylate and methyl methacrylate in a 40/60 molar ratio, and "EL" refers to ethyl lactate.

TABLE 1

| | Sample A | Sample B | Comparative Sample 1 |
|---|---|---|---|
| Polymer | Polymer 1 + HEMA/MMA (70/30 w/w) | Polymer 2 + Polymer 3 (50/50 w/w) | Comparative Polymer 1 |
| Cure catalyst | 0.1% | 0.1% | 0.1% |
| Solvent | PGMEA/EL 95/5 | PGMEA/EL 85/15 | PGMEA/EL 95/5 |
| Coating Enhancer | 4.5% | 4.5% | 4.5% |
| Siloxane stabilizer | Mineral acid (3%) | Mineral acid (3%) | Mineral acid (3%) |

EXAMPLE 8

Films of each of Samples A and B and Comparative Sample 1 were spin-coated on 200 mm silicon wafers to a target film thickness of 400 Å using either a TEL track or ACT 8 tool in a clean room environment. The film thickness on each wafer was measured on a thermawave apparatus and the film thickness of coupons was measured on an elipsometer. The films were cured at 240° C. for 60 seconds to form a siloxane underlayer. The silicon content of the underlayers was approximately 18% for Sample A, approximately 25% for Sample B, and approximately 40% for the Comparative Sample. The optical constants (refractive index (n) and extinction coefficient (k)) were determined for each of the films and are reported in Table 2.

TABLE 2

| | Sample A | Sample B | Comparative Sample 1 |
|---|---|---|---|
| n/k (193 nm) | 1.67/0.12 | 1.72/0.15 | 1.67/0.22 |
| n/k (248 nm) | 1.58/0.004 | 1.60/0.006 | 1.50/0.007 |

EXAMPLE 9

Films of each of Samples A and B and Comparative Sample 1 were spin-coated on 200 mm silicon wafers according to the procedure of Example 8, and the films were cured at 240° C. for 60 seconds to form a siloxane underlayer. Each siloxane underlayer film was contacted with aqueous tetramethylammonium hydroxide (TMAH, 2.38 wt %) developer, PGMEA, or a mixture of PGMEA/PGME (30/70 w/w). PGMEA remained in contact with each of the siloxane underlayer films for 90 seconds, and each of TMAH and the PGMEA/PGME mixture remained in contact with each siloxane underlayer film for 60 seconds, after which time the solvents were removed by spin-drying the wafer. The spin-dried films were then baked at 105° C. for 60 seconds to remove any excess water or solvent. The difference in film thickness between the siloxane underlayers before and after such solvent contact step is reported in Table 3 as the percentage of film thickness loss. These data show that the siloxane underlayers of the invention possess the same solvent strip resistance as conventional siloxane underlayers.

TABLE 3

|  | Sample A | Sample B | Comparative Sample 1 |
|---|---|---|---|
| PGMEA | <1% | <1% | <1% |
| PGMEA/PGME | <1% | <1% | <1% |
| TMAH | <1% | <1% | <1% |

EXAMPLE 10

Films (approximately 400 Å) of each of Samples A and B and Comparative Sample 1 were spin-coated (1500 rpm) on 200 mm silicon wafers and cured at 240° C. for 60 seconds to form a siloxane underlayer. The underlayer films were then subjected to a blanket oxygen etch to mimic carbon underlayer open etch. The siloxane underlayers were then contacted with a wet etch solution containing concentrated sulfuric acid (96%) and hydrogen peroxide (30%) at a temperature of 152-158° C. for 3 min. The thickness of the siloxane underlayer after contact with the wet etching solution is compared with the thickness of the same film after the blanket oxygen etch and the percentage of siloxane underlayer remaining after contact with the wet etching solution is reported in Table 4. These data clearly show that the siloxane underlayers of the invention are almost completely removed by a wet stripping process using sulfuric acid and hydrogen peroxide.

TABLE 4

|  | Sample A | Sample B | Comparative Sample 1 |
|---|---|---|---|
| % Film Removed (with O₂ etch) | 87 | 84 | 0 |
| % Film Removed (without O₂ etch) | 93 | Not tested | 8 |

EXAMPLE 11

Films (approximately 400 Å) of each of Samples A and B and Comparative Sample 1 were spin-coated (1500 rpm) on 200 mm silicon wafers and cured at 240° C. for 60 seconds to form a siloxane underlayer. The underlayer films were then subjected to an oxygen plasma etch to determine their etch rate. The comparative underlayer had a relative etch rate of 1, the siloxane underlayer from Sample A had a relative etch rate of 2.5, and the siloxane underlayer from Sample B had a relative etch rate of 1.7.

EXAMPLE 12

Underlayer Sample C having a siloxane polymer of the invention and a secondary siloxane polymer was prepared by combining the components shown in Table 5. Sample C included a long chain alkanol as a coating enhancer, an ammonium halide as a cure catalyst, and a mineral acid as the siloxane stabilizer, in the amounts reported in Table 5. The solvent ratio reported in Table 5 was w/w.

TABLE 5

| Sample C | |
|---|---|
| Polymer | Polymer 4 + Comparative Polymer 1(50/50 w/w) |
| Cure catalyst | 0.1% |
| Solvent | PGMEA/EL 85/15 |
| Coating Enhancer | 4.5% |
| Siloxane stabilizer | Mineral acid (3%) |

EXAMPLE 13

Underlayer Samples D-F are prepared by combining the components shown in Table 6. Each Sample includes an ammonium halide cure catalyst, a long chain alkanol as a coating enhancer and a mineral acid as the siloxane stabilizer, in the amounts reported in Table 6. "ANTMA/HEMA" is a copolymer of anthracenyl methacrylate and hydroxyethyl methacrylate in a molar ratio of 45/55. "STY/HEMA" is a copolymer of styrene and hydroxyethyl methacrylate in a molar ratio of 50/50. "SSP1" refers to Secondary Siloxane Polymer 1 which is glycidyloxypropyl terminated polydimethylsiloxane.

TABLE 6

|  | Sample D | Sample E | Sample F |
|---|---|---|---|
| Polymer | Polymer 3 + ANTMA/HEMA (70/30 w/w) | Polymer 6 + STY/HEMA (70/30 w/w) | Polymer 6 + SSP1 (70/30 w/w) |
| Cure catalyst | 0.1% | 0.15% | 0.15% |
| Solvent | PGMEA/EL 90/10 | PGMEA/EL 85/15 | PGMEA/EL 95/5 |
| Coating Enhancer | 4.75% | 5% | 4% |
| Siloxane stabilizer | Mineral acid (3%) | Mineral acid (3.5%) | Mineral acid (4%) |

EXAMPLE 14

Polymer 8 (shown below) is prepared according to the general procedures of Example 1 except that the following monomers in the following amounts are used: methyl phenyl dimethoxysilane (15 mmol), methyl glycidyloxypropyl diethoxysilane (30 mmol), and dihydrofuran-2,5-dionylethyl triethoxysilane (55 mmol). The silicon content of Polymer 8 is 15.7 wt %.

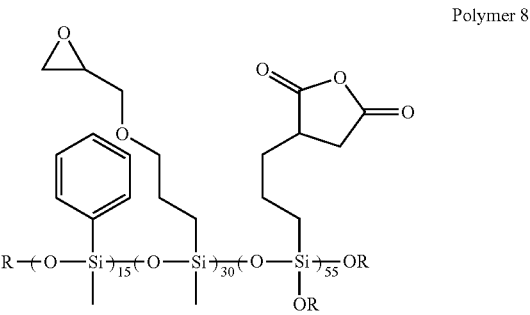

Polymer 8

EXAMPLE 15

Sample G is prepared by combining the components shown in Table 7. Sample G includes 0.1% of an ammonium halide cure catalyst, a long chain alkanol as a coating enhancer and a mineral acid as the siloxane stabilizer, in the amounts reported in Table 7.

TABLE 7

| | Sample G |
|---|---|
| Polymer | Polymer 8 |
| Solvent | PGMEA/EL 85/15 (w/w) |
| Coating Enhancer | 5.2% |
| Siloxane stabilizer | Mineral acid (3%) |

EXAMPLE 16

Preparation of Polymer 9

The procedure of Example 2 was repeated except that the methyl mercaptopropyl diethoxysilane was replaced with an equivalent molar amount of methyl cyanoethyl dimethoxysilane (75 mmol, 50.0 mol %) to provide Polymer 9, having the following structure where R is ethyl, methyl or H. Polymer 9 had an $M_w$ of 1404 Da and a silicon content of 24 wt %.

Polymer 9

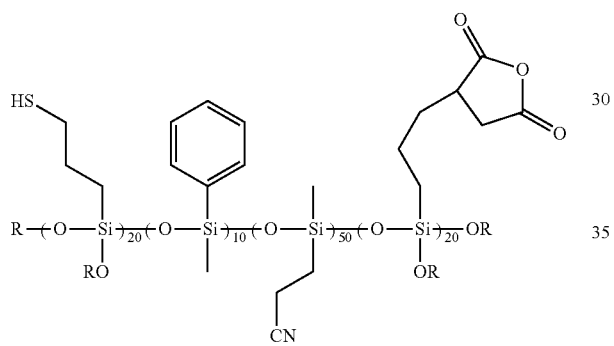

EXAMPLE 17

Preparation of Polymer 10

The procedure of Example 4 was repeated except that the molar amount of each of hydroxymethyl triethoxysilane, methyl glycidyloxypropyl diethoxysilane, and dihydrofuran-2,5-dionylpropyl triethoxysilane was varied to provide Polymer 10, shown below, where R is ethyl, methyl or H. Polymer 10 had an $M_w$ of 6080 Da and a silicon content of 21.5 wt %.

Polymer 10

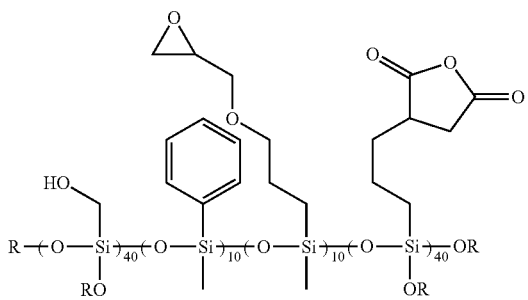

EXAMPLE 18

Preparation of Polymer 11

The general procedure used to make Polymer 5 in Example 5 was repeated except that the molar amounts of the monomers were varied to prepare Polymer 11, R is ethyl, methyl or H. Polymer 11 had an $M_w$ of 1335 Da and a silicon content of 22 wt %.

Polymer 11

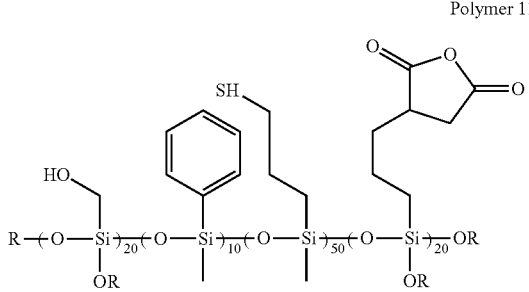

EXAMPLE 19

Preparation of Polymers 12 and 13

The general procedures of Examples 1 or 2 were repeated to prepare Polymers 12 and 13, shown below, where the numbers refer to the molar ratio of each monomer and R is ethyl, methyl or H in Polymer 12 or ethyl, hydroxyethyl or H in Polymer 13. Polymer 12 had an $M_w$ of 1538 Da and a silicon content of 26 wt %. Polymer 13 had an $M_w$ of 1470 Da and a silicon content of 20 wt %.

Polymer 12

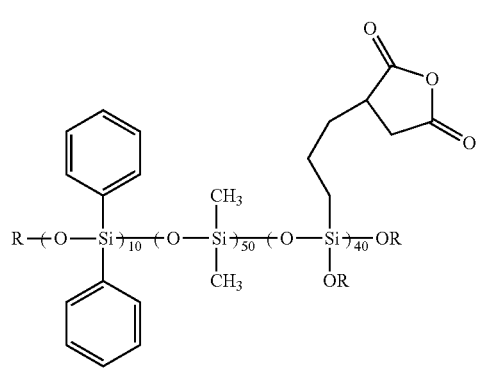

Polymer 13

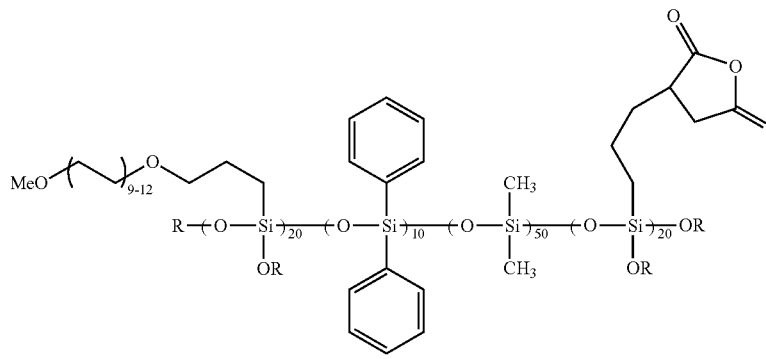

EXAMPLE 20

Preparation of Comparative Polymers 2-6

The general procedures of Examples 1, 2 or 6 were repeated to prepare Comparative Polymers 2-6, shown below, where the numbers refer to the molar ratio of each monomer and R in each case is ethyl, methyl or H. Comparative Polymers 2 and 3 were composed only of "T" monomers. Comparative Polymer 4 was composed of <30% of monomers comprising one or more functional moieties chosen from hydroxy, mercapto, epoxy, glycidyloxy, cyano, alkyleneoxy, sulfolanyl, and —C(O)—O—C(O)—. Comparative Polymer 5 did not contain one or more —C(O)—O—C(O)— moieties. Comparative Polymer 6 was composed of a monomer of the formula $SiX_4$ as polymerized units. Comparative Polymer 2 had an $M_w$ of 2506 Da and a silicon content of 26 wt %. Comparative Polymer 3 had an $M_w$ of 4300 Da and a silicon content of 22 wt %. Comparative Polymer 4 had an $M_w$ of 842 Da and a silicon content of 31 wt %. Comparative Polymer 5 had an $M_w$ of 897 Da an 29 wt %.

Comparative Polymer 2:

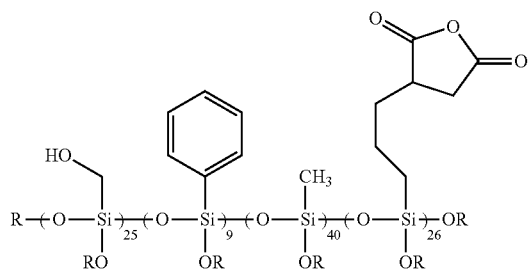

Comparative Polymer 3:

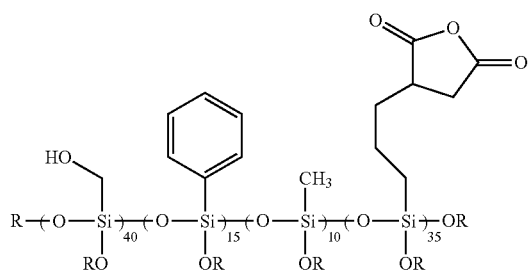

Comparative Polymer 4:

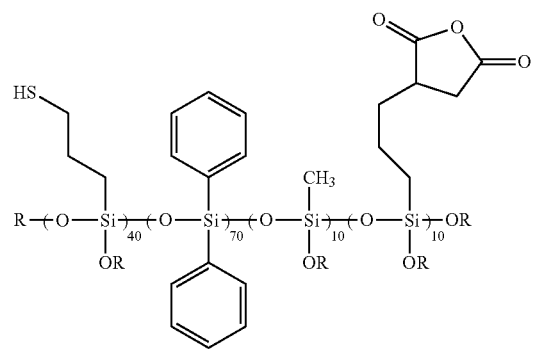

Comparative Polymer 5:

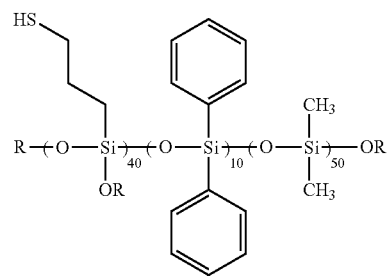

Comparative Polymer 6:

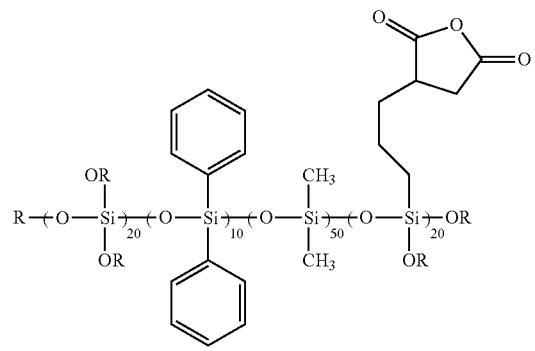

EXAMPLE 21

Films (approximately 400 Å thickness) of each of the samples listed in Table 8 were spin-coated (1500 rpm) on 200 mm silicon wafers and cured at 240° C. for 60 seconds to form a siloxane underlayer. The underlayer films were then subjected to a blanket oxygen etch to mimic carbon underlayer open etch. The siloxane underlayers were then contacted with a wet etch solution containing concentrated sulfuric acid (96%) and hydrogen peroxide (30%) at a temperature of 152-158° C. for 5 min. Polymers passed the SPM strip test when ≥80 of the polymer was removed.

TABLE 8

| Polymer Sample | % Removed |
|---|---|
| Polymer 1 | 86 |
| Polymer 2 | 90 |
| Polymer 3 | 89 |
| Polymer 4 | 100 |
| Polymer 5 | 95 |
| Polymer 6 | 96 |
| Polymer 7 | 95 |
| Polymer 9 | 95 |
| Polymer 10 | 100 |
| Polymer 11 | 93 |
| Polymer 12 | 88 |
| Polymer 13 | 88 |
| Comparative Polymer 1 | 0 |
| Comparative Polymer 2 | 12 |
| Comparative Polymer 3 | 44 |
| Comparative Polymer 4 | 30 |
| Comparative Polymer 5 | 17 |
| Comparative Polymer 6 | 31 |

What is claimed is:

1. The present invention provides a siloxane polymer comprising as polymerized units one or more first monomers of formula (1) or dimers thereof and one or more second monomers of formula (2) or dimers thereof $$R_2SiX_2 \quad (1)$$

$$RSiX_3 \quad (2)$$

wherein each R is independently chosen from aryl, aralkyl, alkyl, alkenyl, aralkenyl, and $R^1$; $R^1$ is a $C_{2-30}$ organic radial comprising one or more —C(O)—O—C(O)— moieties; and each X is a hydrolyzable moiety; wherein at least one R is $R^1$; and wherein ≥30% of the monomers comprising the polymer comprise one or more functional moieties chosen from hydroxy, mercapto, epoxy, glycidyloxy, cyano, alkyleneoxy, sulfolanyl, and —C(O)—O—C(O)—; and wherein the polymer is free of monomers of the formula $HSiX_3$ and $SiX_4$ as polymerized units.

2. The siloxane polymer of claim 1 comprising 2 or more different monomers of formula (1) or dimers thereof.

3. The siloxane polymer of claim 1 comprising 2 or more different monomers of formula (2) or dimers thereof.

4. The siloxane polymer of claim 1 wherein one or more R groups are substituted with one or more moieties are chosen from $C_{1-20}$ alkyl, $C_{1-20}$ alkoxy, $C_{1-20}$ hydroxyalkyl, $C_{2-30}$ alkoxyalkyl, hydroxy, mercapto, epoxy, glycidyloxy, cyano, alkyleneoxy, and sulfolanyl.

5. The siloxane polymer of claim 1 wherein $R^1$ is a 5-7 membered cyclic anhydride.

6. The siloxane polymer of claim 1 wherein $R^1$ is chosen from an organic radical of the formula:

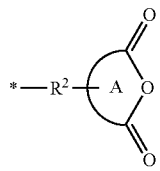

where $R^2$ is a chemical bond or a $C_{1-20}$ organic radical, A represents a 5-7 membered cyclic anhydride, and * represents the point of attachment to silicon.

7. The siloxane polymer of claim 6 wherein R1 is chosen from dihydrofuran-2,5-dionyleth-2-yl, dihydrofuran-2,5-dionylprop-3-yl, dihydrofuran-2,5-dionylbut-4-yl, dihydrofuran-2,5-dionylbut-3-yl, dihydrofuran-2,5-dionylpent-5-yl, dihydrofuran-2,5-dionylpent-4-yl, dihydrofuran-2,5-dionyl-2,2-dimethylprop-3-yl, dihydrofuran-2,5-dionyl-2-methylprop-3-yl, dihydrofuran-2,5-dionylprop-2-yl, dihydrofuran-2,5-dionylhex-6-yl, dihydrofuran-2,5-dionylhex-4-yl, dihydrofuran-2,5-dionylhex-3-yl, isobenzofuran-1,3-dionyl-5-eth-2-yl, isobenzofuran-1,3-dionyl-5-prop-3-yl, isobenzofuran-1,3-dionyl-5-but-4-yl, benzo[de]isochromene-1,3-dionyl-6-propyl, 5-propylhexahydroisobenzofuran-1,3-dione, (3aS,4R,5S,7R,7aS)-5-(trimethoxysilyl)hexahydro-4,7-methanoisobenzofuran-1,3-dione, (3aS,4R,5S,7R,7aR)-5-(trimethoxysilyl)hexahydro-4,7-epoxyisobenzofuran-1,3-dione, dihydro-2H-pyran-2,6(3H)-dionyl-4-methyl, dihydro-2H-pyran-2,6(3H)-dionyl-4-eth-2-yl, dihydro-2H-pyran-2,6(3H)-dionyl-4-prop-3-yl, dihydro-2H-pyran-2,6(3H)-diony-4-lhex-6-yl, tetrahydro-1H-cyclopenta[c]furan-1,3(3aH)-dionyl-3a-prop-3-yl, and hexahydroisobenzofuran-1,3-dionyl-3a-eth-2-yl.

8. The siloxane polymer of claim 1 wherein at least one R is chosen from aryl, substituted aryl, and aralkyl.

9. The siloxane polymer of claim 1, wherein the siloxane polymer comprises ≤45 wt % silicon.

10. A composition comprising the siloxane polymer of claim 1 and an organic solvent.

11. A method of patterning comprising: (a) coating a substrate with the composition of claim 9 to form a siloxane polymer layer on the substrate; (b) curing the siloxane polymer layer to form a siloxane underlayer; (c) disposing a layer of a photoresist on the siloxane underlayer; (d) patternwise exposing the photoresist layer to form a latent image; (e) developing the latent image to form a patterned photoresist layer having a relief image therein; (f) transferring the relief image to the substrate; and (g) removing the siloxane underlayer.

12. The method of claim 11 further comprising coating a layer of a high carbon-content organic coating on the substrate prior to step (a).

13. The method of claim 11 wherein the siloxane underlayer is removed by a wet stripping step.

14. The method of claim 13 wherein the wet stripping step comprises contacting the siloxane underlayer with a mixture of sulfuric acid and hydrogen peroxide or a mixture of ammonia and hydrogen peroxide.

* * * * *